(12) United States Patent
Hu

(10) Patent No.: US 9,502,322 B2
(45) Date of Patent: Nov. 22, 2016

(54) MOLDING COMPOUND SUPPORTED RDL FOR IC PACKAGE

(71) Applicant: Dyi-Chung Hu, Hsinchu County (TW)

(72) Inventor: Dyi-Chung Hu, Hsinchu County (TW)

(*) Notice: Subject to any disclaimer, the term of this patent is extended or adjusted under 35 U.S.C. 154(b) by 0 days.

(21) Appl. No.: 14/522,760

(22) Filed: Oct. 24, 2014

(65) Prior Publication Data

US 2016/0118312 A1    Apr. 28, 2016

(51) Int. Cl.
| | | |
|---|---|---|
| *H05K 1/11* | (2006.01) | |
| *H01L 23/00* | (2006.01) | |
| *H01L 23/13* | (2006.01) | |
| *H01L 23/48* | (2006.01) | |
| *H05K 3/40* | (2006.01) | |
| *H01L 23/14* | (2006.01) | |
| *H01L 21/48* | (2006.01) | |
| *H05K 1/02* | (2006.01) | |
| *H05K 3/46* | (2006.01) | |
| *H05K 3/28* | (2006.01) | |

(52) U.S. Cl.
CPC .............. *H01L 23/14* (2013.01); *H01L 21/481* (2013.01); *H01L 24/97* (2013.01); *H05K 1/0298* (2013.01); *H05K 1/111* (2013.01); *H05K 3/28* (2013.01); *H05K 3/4644* (2013.01); *H01L 2224/16225* (2013.01); *H01L 2224/73204* (2013.01); *H01L 2924/15174* (2013.01); *H01L 2924/15311* (2013.01); *H05K 2203/07* (2013.01); *H05K 2203/14* (2013.01)

(58) Field of Classification Search
CPC ................... H01L 21/4846; H01L 23/49816; H01L 23/49822
USPC ........... 257/676, E21.597; 438/125; 174/266
See application file for complete search history.

(56) References Cited

U.S. PATENT DOCUMENTS

| 8,884,431 | B2* | 11/2014 | Lin .................. H01L 23/49816 257/686 |
| 8,937,381 | B1* | 1/2015 | Dunlap .............. H01L 23/3128 257/686 |
| 2008/0111233 | A1* | 5/2008 | Pendse ................ H01L 23/3121 257/712 |
| 2009/0087951 | A1* | 4/2009 | Jeon et al. ..................... 438/118 |
| 2010/0044884 | A1* | 2/2010 | Zbrzezny .......... H01L 23/49811 257/779 |
| 2012/0273960 | A1* | 11/2012 | Park et al. ..................... 257/774 |
| 2013/0105213 | A1* | 5/2013 | Hu et al. ....................... 174/266 |
| 2014/0021617 | A1* | 1/2014 | Lu et al. ....................... 257/758 |
| 2014/0102777 | A1 | 4/2014 | Chen et al. |

* cited by examiner

*Primary Examiner* — Errol Fernandes
*Assistant Examiner* — Brian Turner
(74) *Attorney, Agent, or Firm* — Hauptman Ham, LLP

(57) ABSTRACT

One of the embodiments for a package substrate discloses a molding compound having plurality of metal pillar with middle portion embedded therein; a top end of the metal pillar protrudes above the molding compound; a bottom end of the metal pillar protrudes below the molding compound; a bottom RDL is configured on bottom of the molding compound; the RDL has a plurality of top metal pad and a plurality of bottom metal pad; a density of the plurality of bottom metal pad is higher than the density of the plurality of top metal pad; each metal pillar metal pad is electrically coupled to a corresponding first top metal pad.

23 Claims, 22 Drawing Sheets

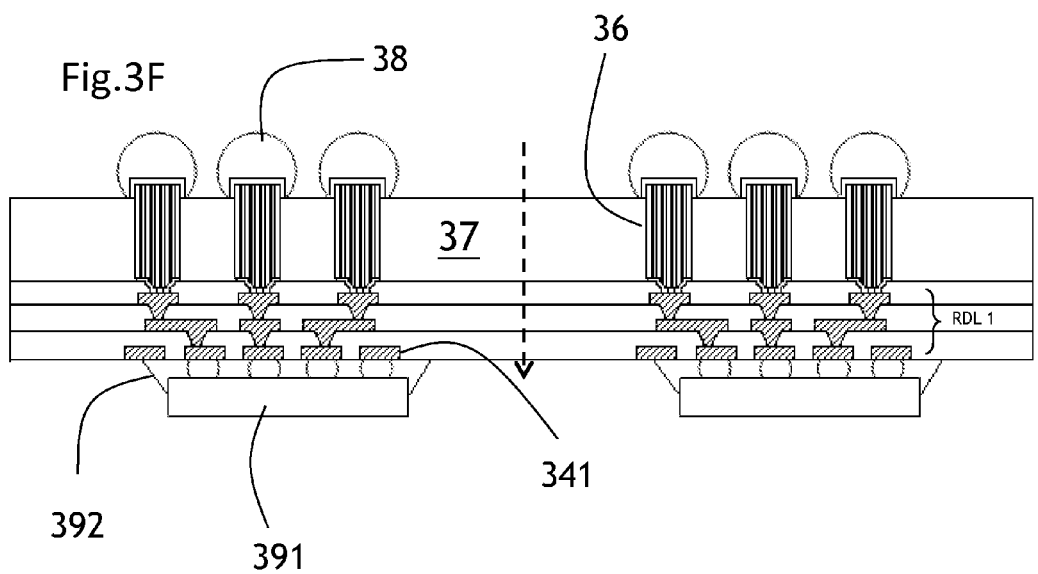
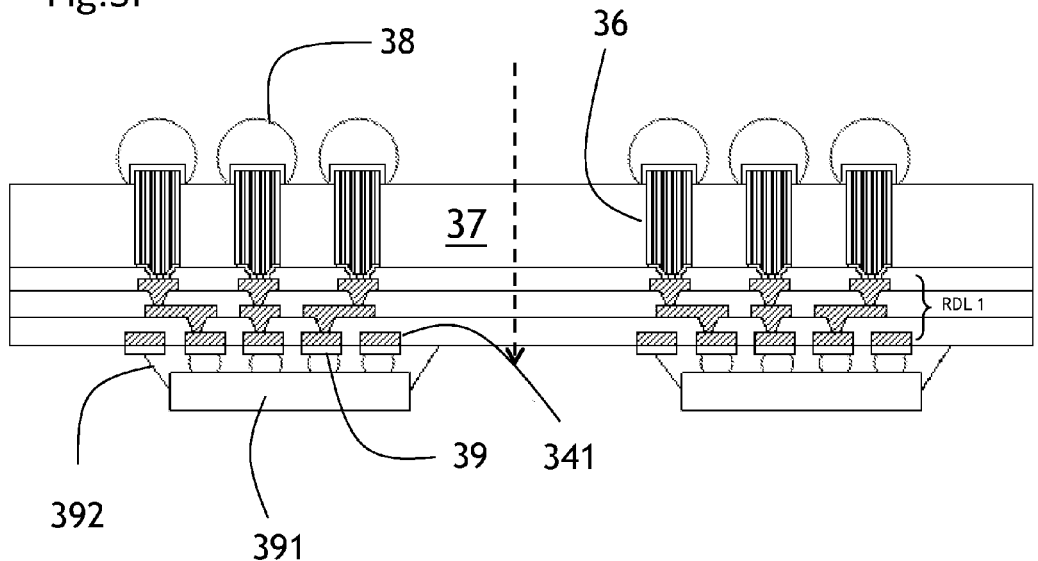

MOLDING COMPOUND SUPPORTED RDL
FOR IC PACKAGE

BACKGROUND

1. Technical Field

The present invention relates to a redistribution layer (RDL) for IC package, especially relates to an RDL supported by molding compound.

2. Description of Related Art

FIG. 1A shows a prior art substrate for IC package

FIG. 1A shows a prior art substrate for IC package disclosed in US2014/0102777A1 which has an embedded silicon interposer 20. The silicon interposer 20 has four lateral sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation therebetween. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 24 is configured and each solder ball 24 is configured on bottom of a corresponding bottom metal pad 220.

FIG. 1B shows a reversed view of FIG. 1A. FIG. 1B is made to present the prior art of FIG. 1A in a position similar to a package substrate of the present invention to facilitate a comparison there between. FIG. 1B shows an up-down view of FIG. 1A. The top solder ball 24 is configured for mounting the package substrate onto a mother board (not shown). The bottom metal pad 210 is configured for a chip or chips to mount.

BRIEF DESCRIPTION OF THE DRAWINGS

FIG. 3F shows an IC chip mounted on bottom of FIG. 3D

FIG. 3F' shows an IC chip mounted on bottom of FIG. 3E

FIGS. 2A~2L and 4A~4C, shows a manufacturing process according to the present invention.

FIG. 4F' shows an IC chip mounted on bottom of FIG. 4E

FIGS. 2A~2L and 5A~5C, shows a manufacturing process according to the present invention.

FIG. 5F' shows an IC chip mounted on bottom of FIG. 5E

DETAILED DESCRIPTION OF THE INVENTION

FIGS. 2A~2L and 3A~3C, shows a manufacturing process according to the present invention.

Figure 3A:
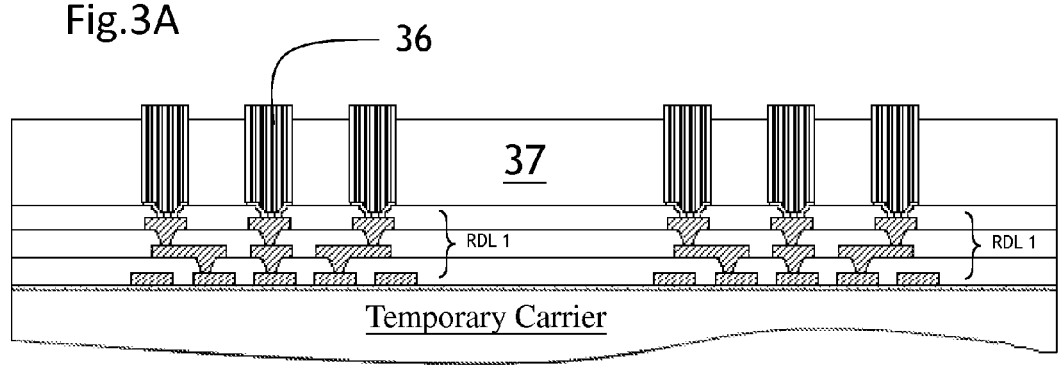
Figure 3B:
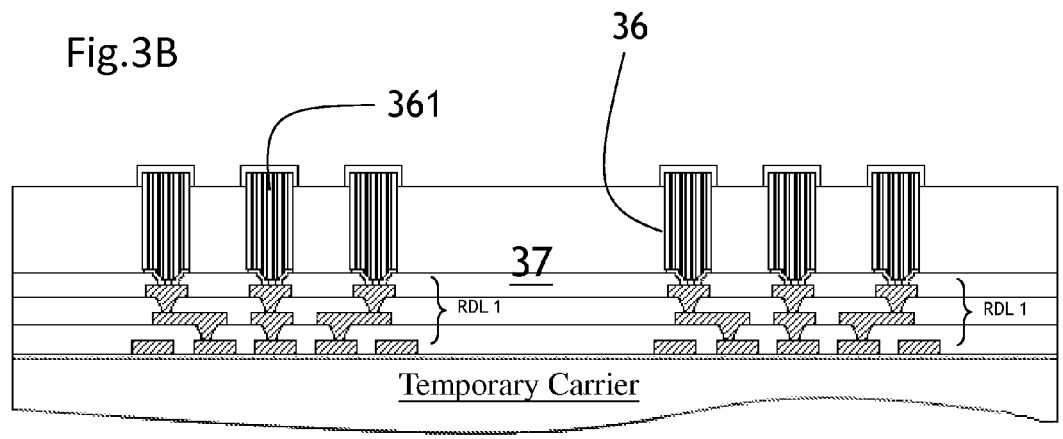
Figure 3C:
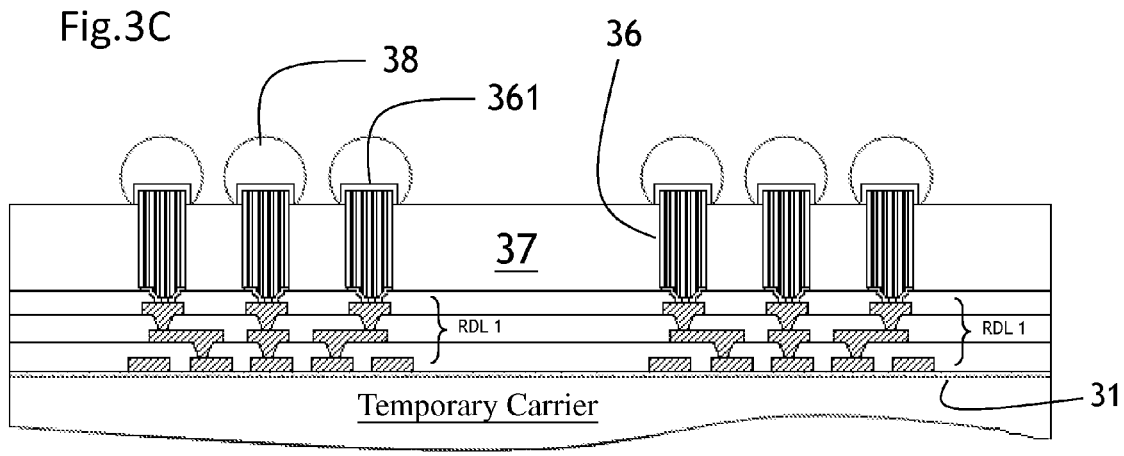
Figure 3D:
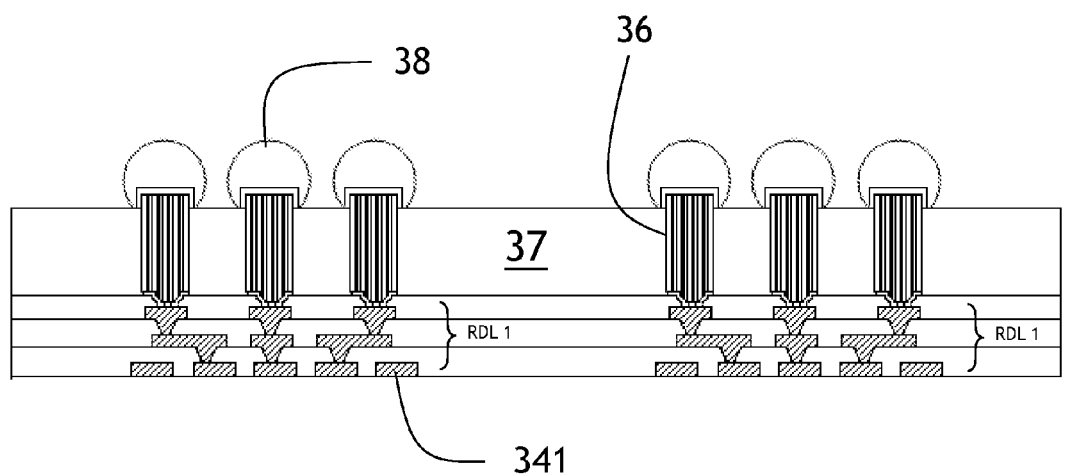
FIG. 3D is a first embodiment of the present invention.

FIG. 3D is a first embodiment of the present invention.

Figure 3E:
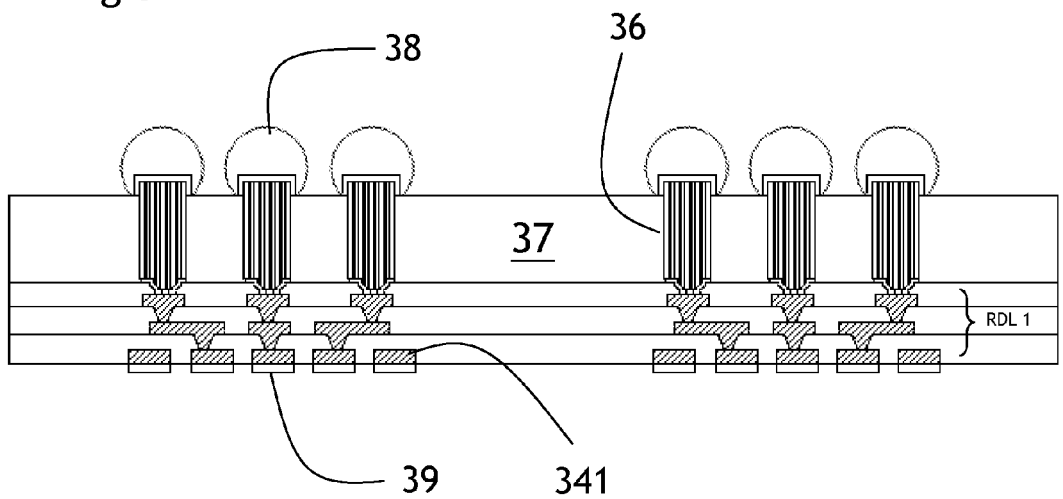
FIG. 3E is a second embodiment of the present invention.

FIG. 3E is a second embodiment of the present invention.

Figure 1A:
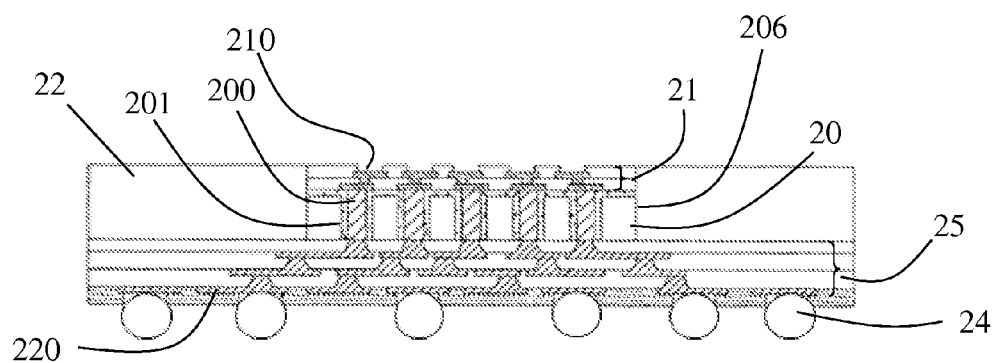
FIG. 1A~1B show a prior art substrate for IC package
Figure 1B:
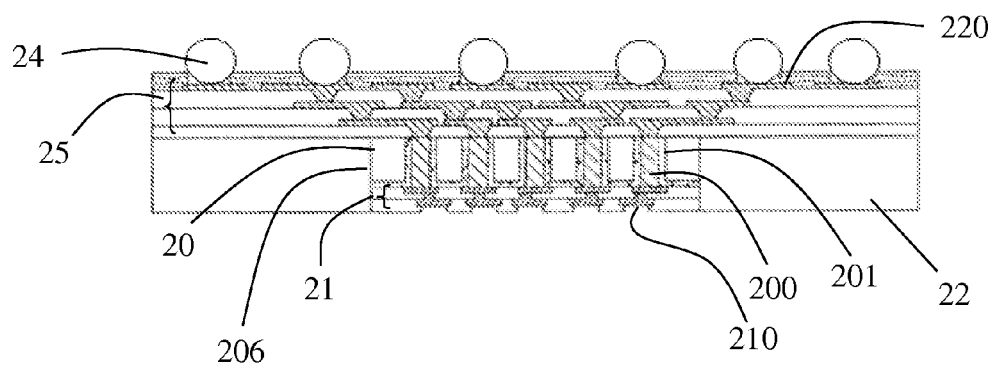
Figure 2A:
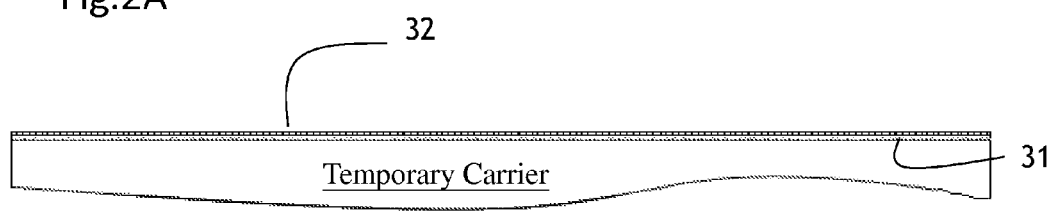
FIGS. 2A~2L and 3A~3C, shows a manufacturing process according to the present invention.

A molding compound supported RDL for IC package is fabricated, includes the following steps:

FIG. 2A shows: preparing a temporary carrier; applying a release layer 31 on top of the temporary carrier; and applying a bottom seed layer 32 on top of the release layer 31.

Figure 2B:
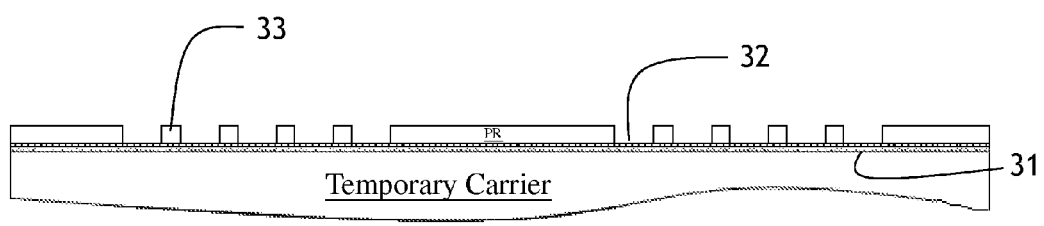

FIG. 2B shows: applying a patterned photo resist 33 on top of the bottom seed layer 32.

Figure 2C:
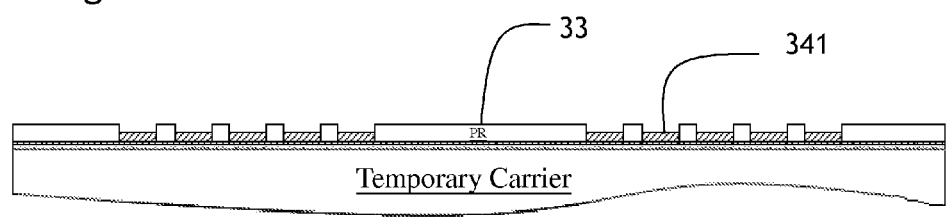

FIG. 2C shows: forming a patterned first bottom metal pad 341.

Figure 2D:
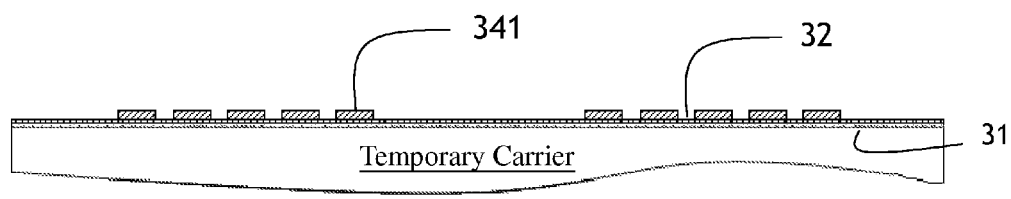

FIG. 2D shows: stripping the photo-resist 33.

Figure 2E:
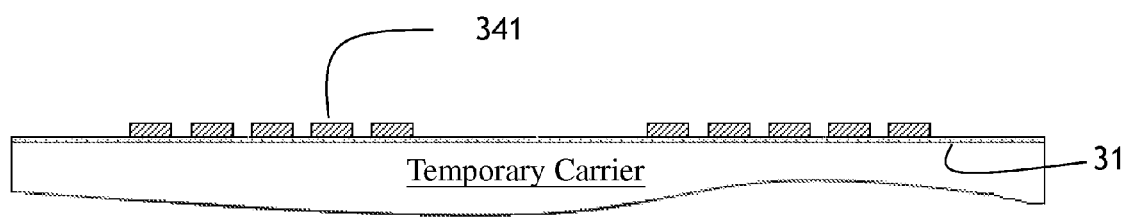

FIG. 2E shows: stripping the bottom seed layer 32 between the first bottom metal pads 341.

Figure 2F:
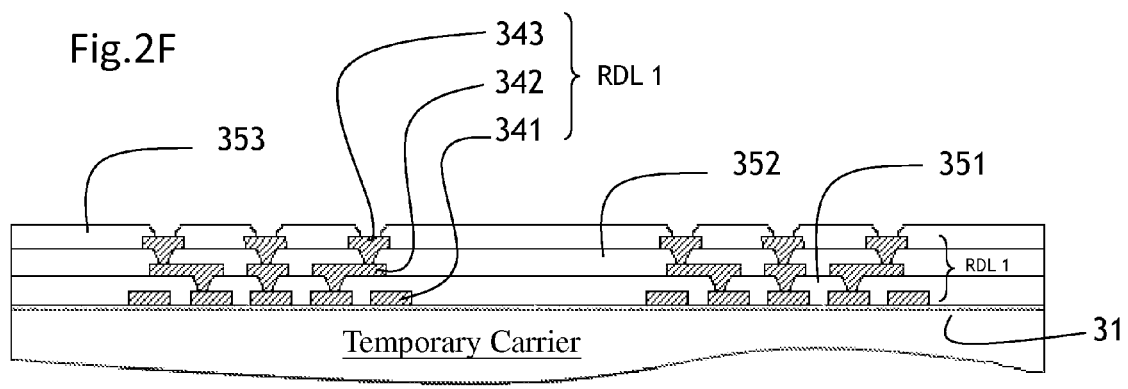
Figure 2G:
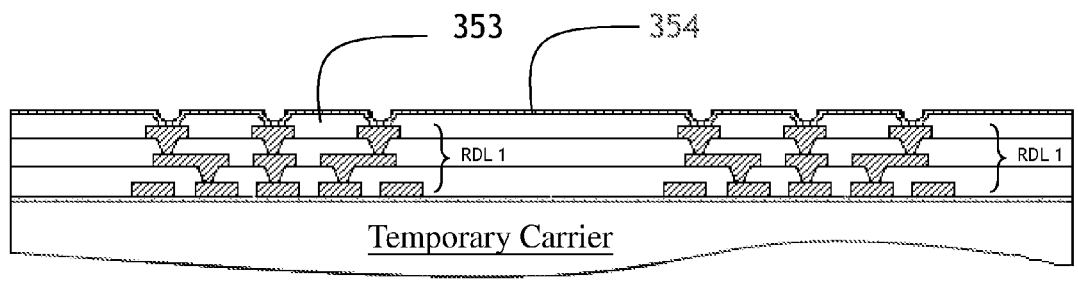
Figure 2H:
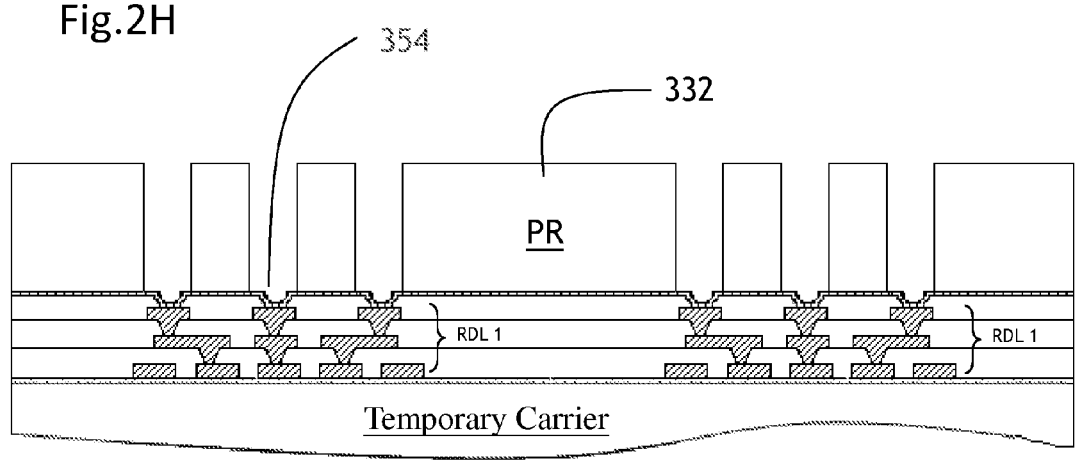
Figure 2I:
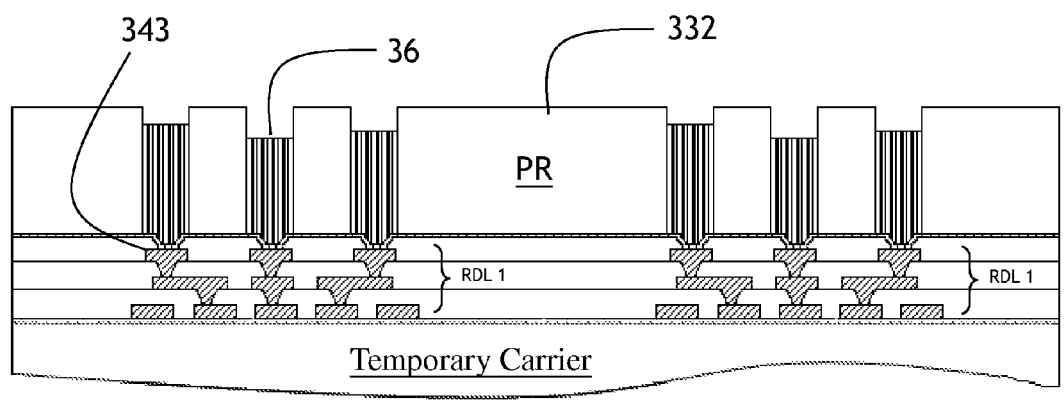
Figure 2J:
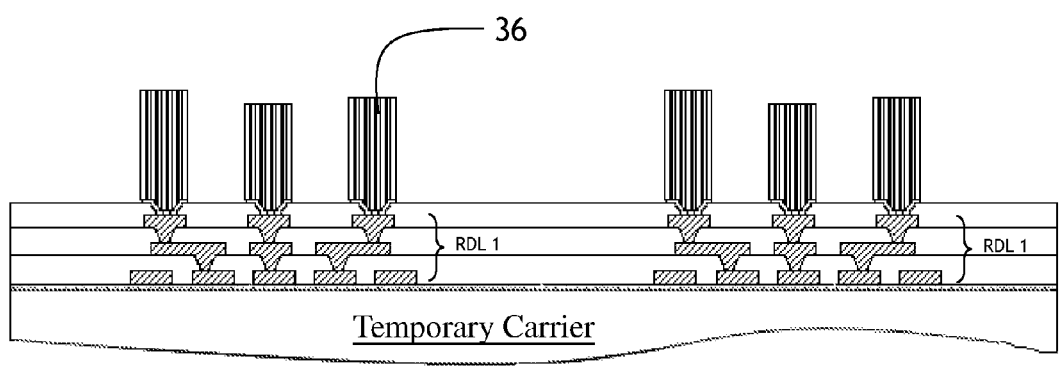
Figure 2K:
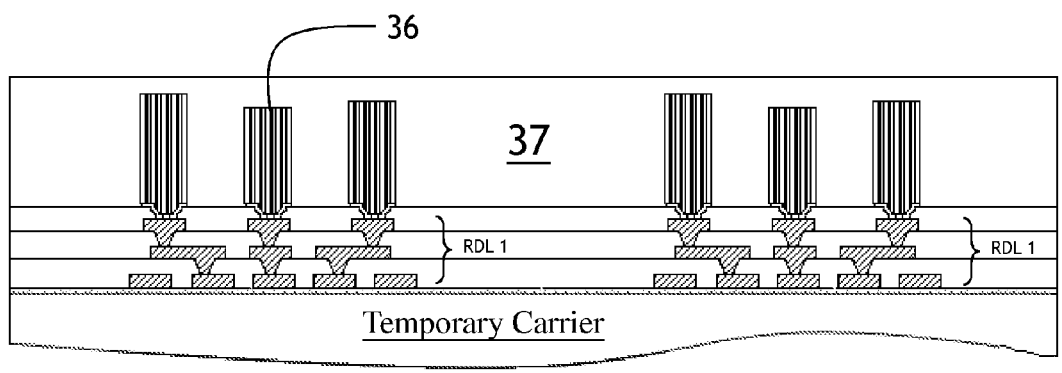
Figure 2L:
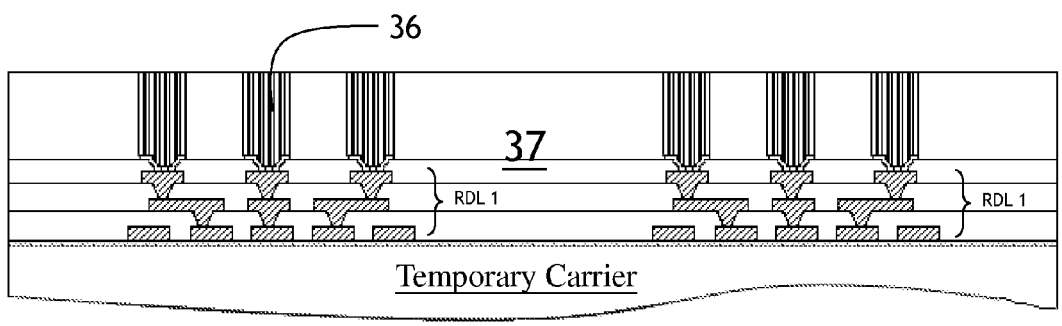

FIG. 2F shows: forming a bottom RDL (RDL 1) using the first bottom metal pad 341 as a starting point; forming a plurality of first top metal pad 343 on top of the bottom RDL (RDL 1), wherein at least one circuit layer 342 is made between the first bottom metal pad 341 and the first top metal pad 343. A first top dielectric layer 353 is formed on top of the first top metal pad 343 and a plurality opening is made to expose a top of each first top metal pad 343. The first bottom metal pad 341, circuit layer 342, and the first top metal pad 343 are embedded in the dielectric layers 351, 352, 353; forming a first top dielectric layer with a plurality of opening, each opening exposes a top of a corresponding first top metal pad;

FIG. 2G shows: applying a seed layer 354 on top of the first top dielectric layer 353 and the first top metal pad;

FIG. 2H shows: forming a patterned photo resist 332 on top of the seed layer 352;

FIG. 2I shows: forming a plurality of metal pillar 36, each is formed on top of a corresponding first top metal pad 343;

FIG. 2J show: stripping the photo resist 332 and leaving the metal pillar 36 exposed;

stripping the top seed layer 322 between metal pillars 36;

revealing the plurality of metal pillar;

FIG. 2K shows: applying a molding compound 37 to encapsulate the plurality of metal pillar 36;

FIG. 2L shows: thinning from top of the molding compound 37; and revealing a top surface of each metal pillar 36.

FIG. 3A shows: removing portion of the molding compound 37 from top;

revealing a top end of each metal pillar 36;

FIG. 3B shows: forming a protection layer 361, such as an Electroless Nickel/Electroless Palladium/Immersion Gold (ENEPIG), on each revealed top of the metal pillar 36;

FIG. 3C shows: planting a plurality of solder ball 38, each is planted on top of a corresponding ENEPIG 361 which brackets a top end of a corresponding metal pillar 36;

FIG. 3D shows: removing the temporary carrier; and removing the bottom seed layer 32 from bottom of each first bottom metal pad 341. FIG. 3D shows a molding compound 37 wrapping a plurality of metal pillar 36, a protection layer 361 is configured on top of a corresponding metal pillar 36;

a solder ball is configured on top of each protection layer 361; a bottom RDL (RDL 1) is made on bottom of the molding compound 37.

FIG. 3E shows: forming a bottom protection layer 39 on bottom of a corresponding first bottom metal pad 341. The protection layer is ENEPIG. The protection layer prevents oxidation of the exposed end of the metal pillar 36 before next step. FIG. 3E shows a molding compound 37 wrapping a plurality of metal pillar 36, a protection layer 361 is configured on top of a corresponding metal pillar 36; a solder ball is configured on top of each protection layer 361; a bottom RDL (RDL 1) is made on bottom of the molding compound 37; a bottom protection layer 39 is made on bottom of a corresponding first bottom metal pad 341.

FIG. 3F shows an IC chip mounted on bottom of FIG. 3D

FIG. 3F shows a chip 391 mounted on bottom of FIG. 3D; the chip 391 is electrically coupled to the first bottom metal pad 341 through a plurality of solder ball. An under fill 392 can be made between the chip 391 and the first bottom metal pad 341.

FIG. 3F' shows an IC chip mounted on bottom of FIG. 3E

FIG. 3F' shows a chip 391 mounted on bottom of FIG. 3E; the chip 391 is electrically coupled to the bottom protection layer 39 through a plurality of solder ball. An under fill 392 can be made between the chip 391 and the bottom protection layer 39.

Figure 3G:
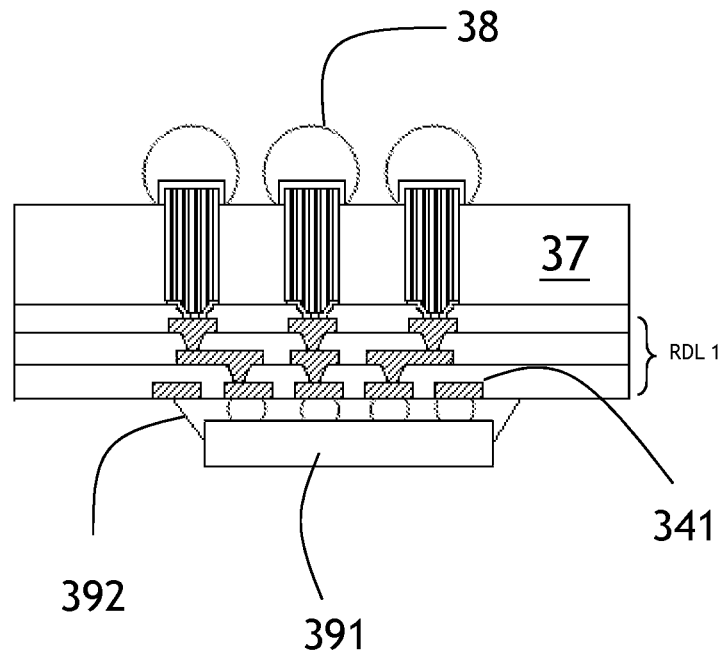
FIG. 3G shows an IC package unit obtained through singulating the product of FIG. 3F.
Figure 3G:
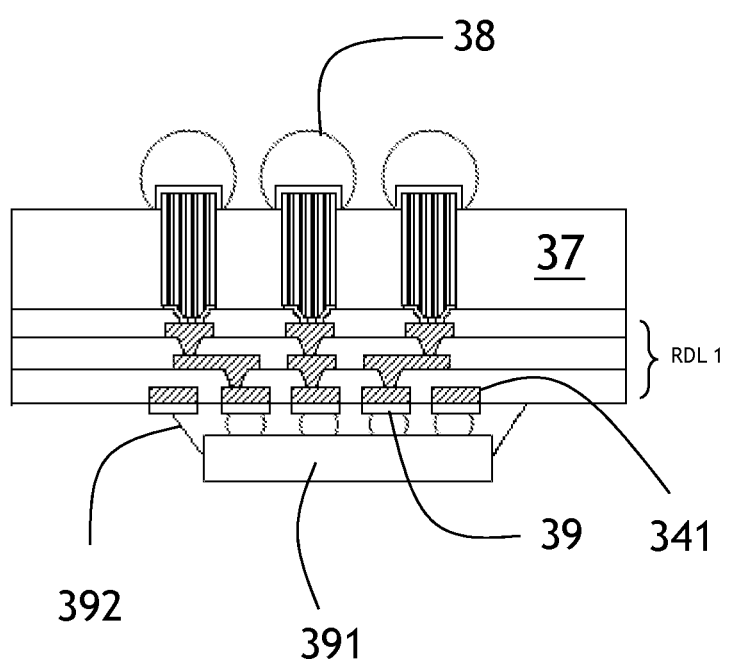

FIG. 3G shows an IC package unit obtained through singulating the product of FIG. 3F.

FIG. 3G shows an IC package which is a package based on the molding compound supported RDL of the first embodiment according to the present invention.

FIG. 3G' shows an IC package unit obtained through singulating the product of FIG. 3F'

FIG. 3G' shows an IC package which is a package based on the molding compound supported RDL of the second embodiment according to the present invention.

FIGS. 2A~2L and 4A~4C, shows a manufacturing process according to the present invention.

Figure 4A:
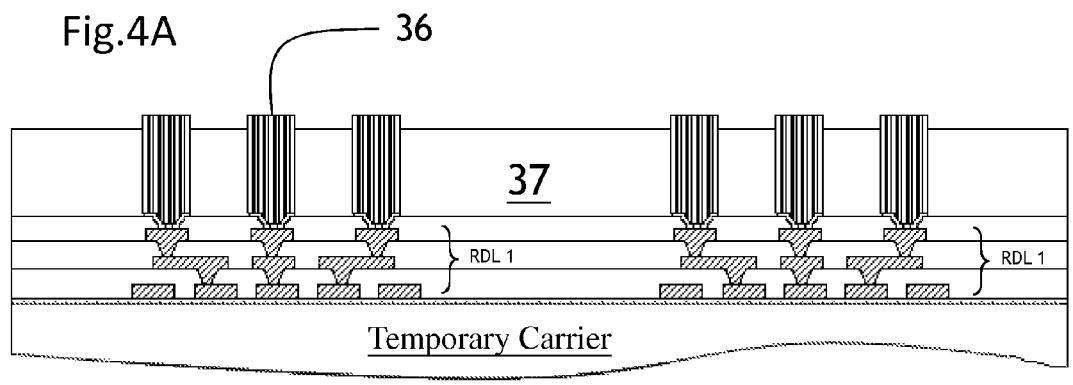
Figure 4B:
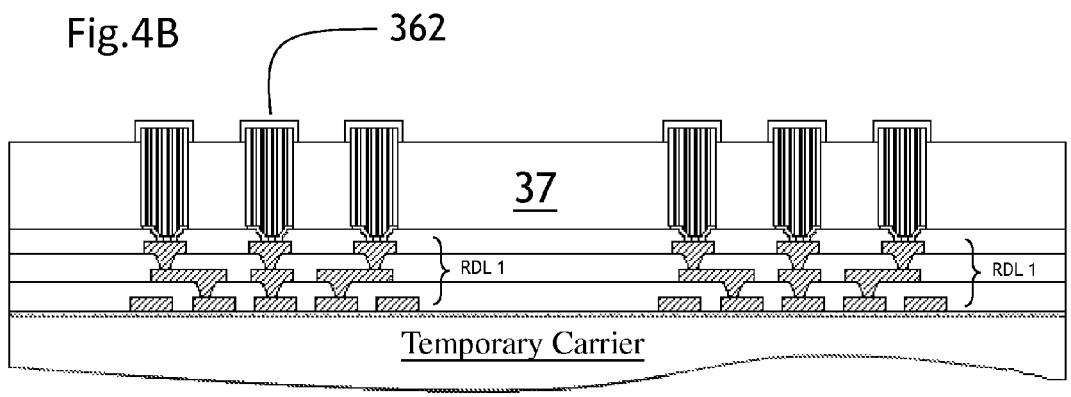
Figure 4C:
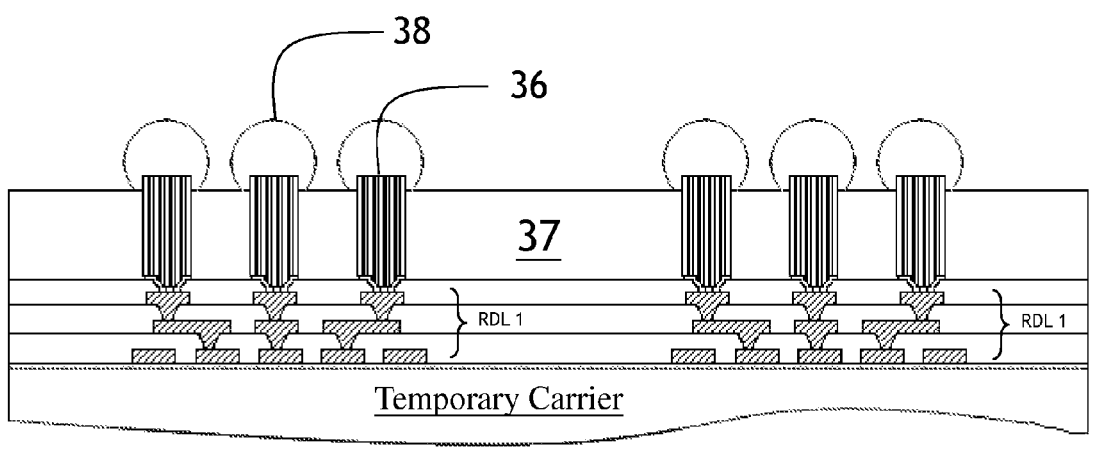
Figure 4D:
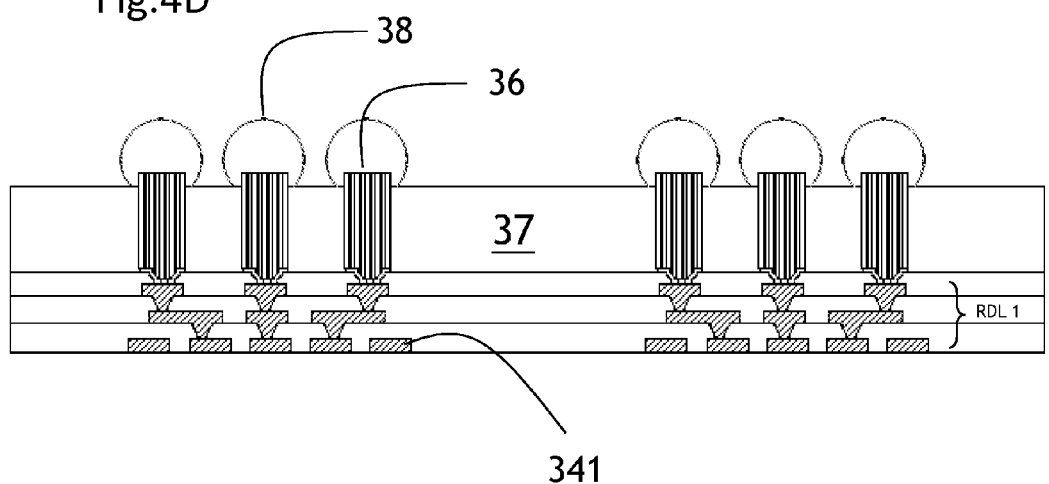
FIG. 4D is a third embodiment of the present invention.

FIG. 4D is a third embodiment of the present invention.

Figure 4E:
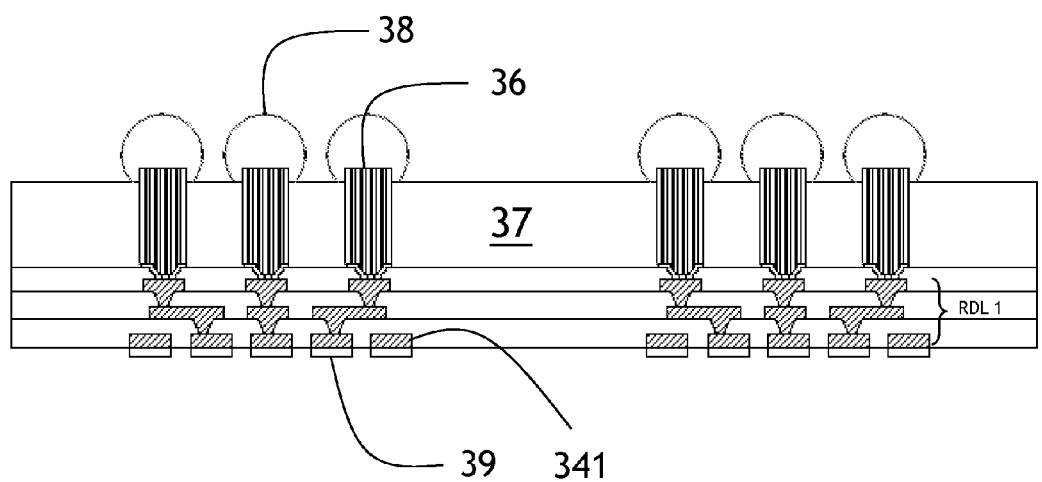
FIG. 4E is a fourth embodiment of the present invention.

FIG. 4E is a fourth embodiment of the present invention.

The manufacturing process of FIGS. 2A~2L is the same as described in previous paragraph and omitted here for simplification.

FIG. 4A shows: removing portion of the molding compound 37 from top;

revealing a top end of each metal pillar 36;

FIG. 4B shows: forming a protection layer 362, such as an Organic Solderability Preservatives (OSP), on each revealed top of the metal pillar 36. The protection layer prevents oxidation of the exposed end of the metal pillar 36 before next step.

FIG. 4C shows: planting a plurality of solder ball 38, each is planted on top of a corresponding protection layer 362, however OSP is cleaned out by soldering flux and heat; therefore, the solder ball 38 can be seen planted directly on a top of a corresponding metal pillar 36.

FIG. 4D shows: removing the temporary carrier; and removing the seed layer 32 from bottom of each first bottom metal pad 341.

FIG. 4E shows: forming a bottom protection layer 39 on bottom of a corresponding first bottom metal pad 341. The protection layer is ENEPIG. FIG. 4E shows a molding compound 37 wrapping a plurality of metal pillar 36; a solder ball is configured on top of a corresponding metal pillar 36; a bottom RDL (RDL 1) is made on bottom of the molding compound 37; a bottom protection layer 39 is made on bottom of a corresponding first bottom metal pad 341.

Figure 4F:
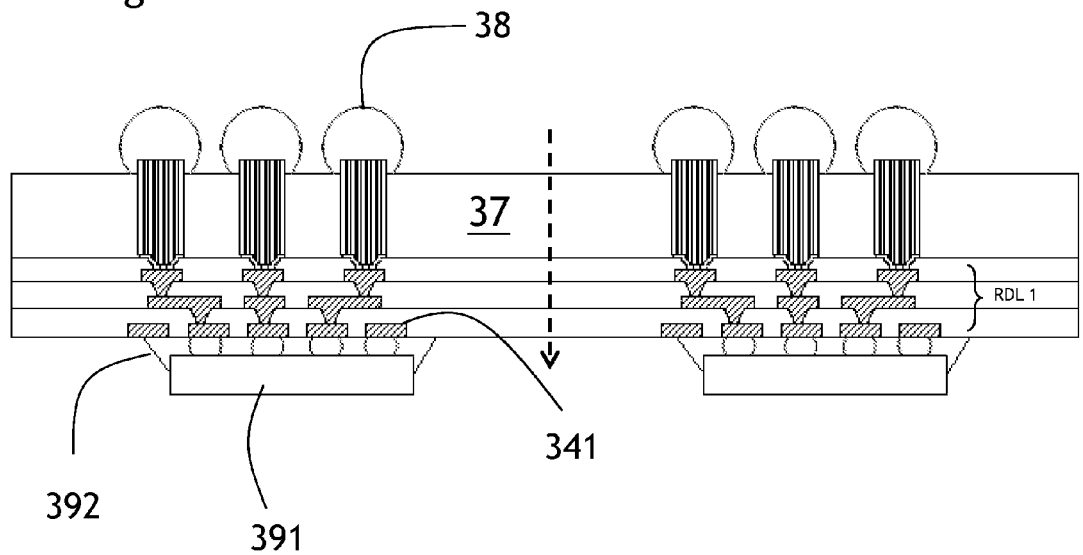
FIG. 4F shows an IC chip mounted on bottom of FIG. 4D
Figure 4F:
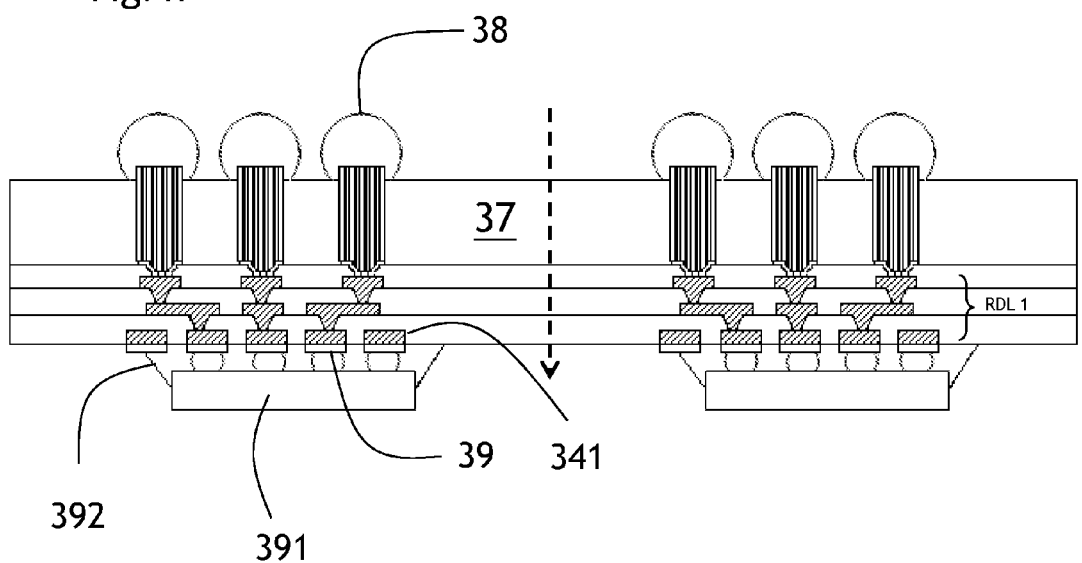

FIG. 4F shows an IC chip mounted on bottom of FIG. 4D

FIG. 4F shows an IC chip mounted on bottom of FIG. 4D; the chip 391 is electrically coupled to the first bottom metal pad 341 through a plurality of solder ball. An under fill 392 can be made between the chip 391 and the first bottom metal pad 341.

FIG. 4F' shows an IC chip mounted on bottom of FIG. 4E

FIG. 4F' shows an IC chip 391 mounted on bottom of FIG. 4E; the chip 391 is electrically coupled to the bottom protection layer 39 through a plurality of solder ball. An under fill 392 can be made between the chip 391 and the bottom protection layer 39.

Figure 4G:
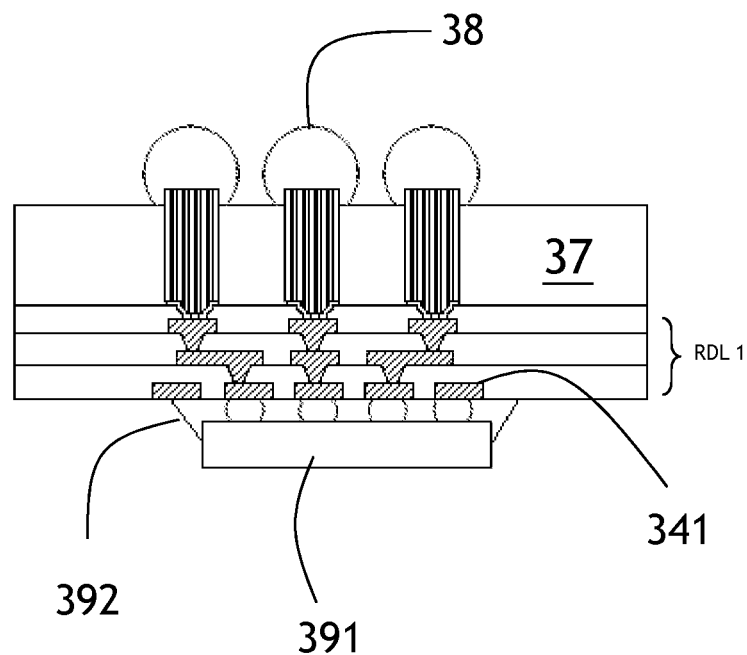
FIG. 4G shows an IC package unit obtained through singulating the product of FIG. 4F.
Figure 4G:
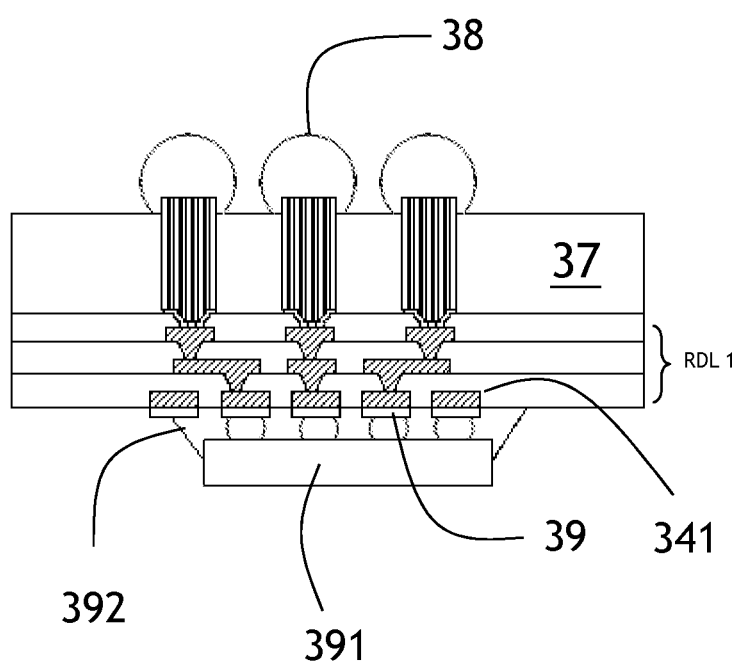

FIG. 4G shows an IC package unit obtained through singulating the product of FIG. 4F.

FIG. 4G shows an IC package which is a package based on the molding compound supported RDL of the third embodiment according to the present invention.

FIG. 4G' shows an IC package unit obtained through singulating the product of FIG. 4F'

FIG. 4G' shows an IC package which is a package based on the molding compound supported RDL of the fourth embodiment according to the present invention.

FIGS. 2A~2L and 5A~5C, shows a manufacturing process according to the present invention.

Figure 5A:
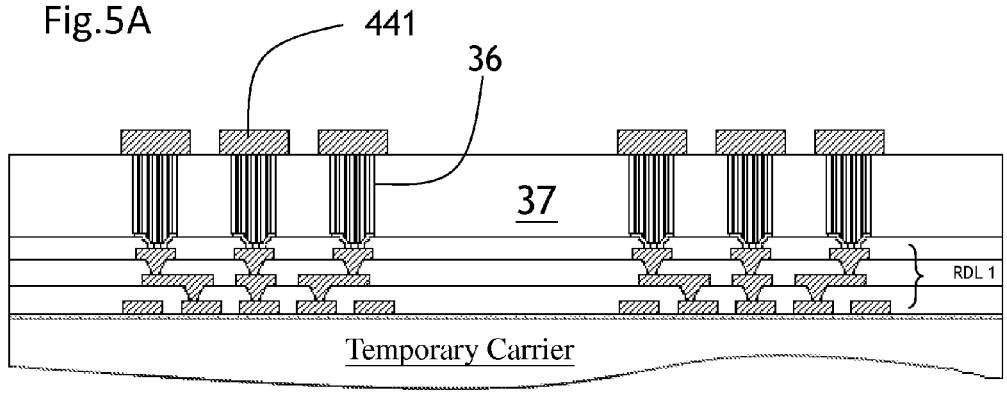
Figure 5B:
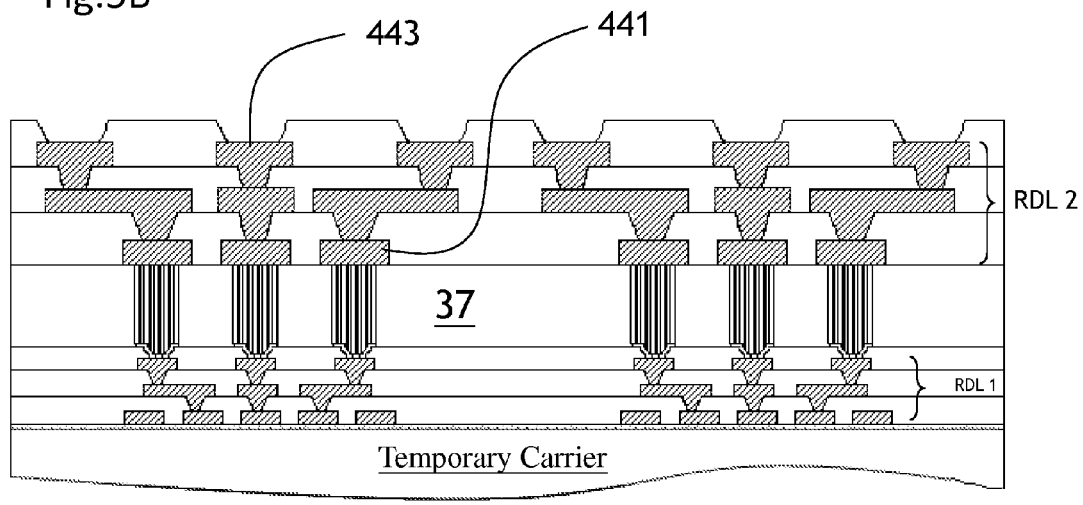
Figure 5C:
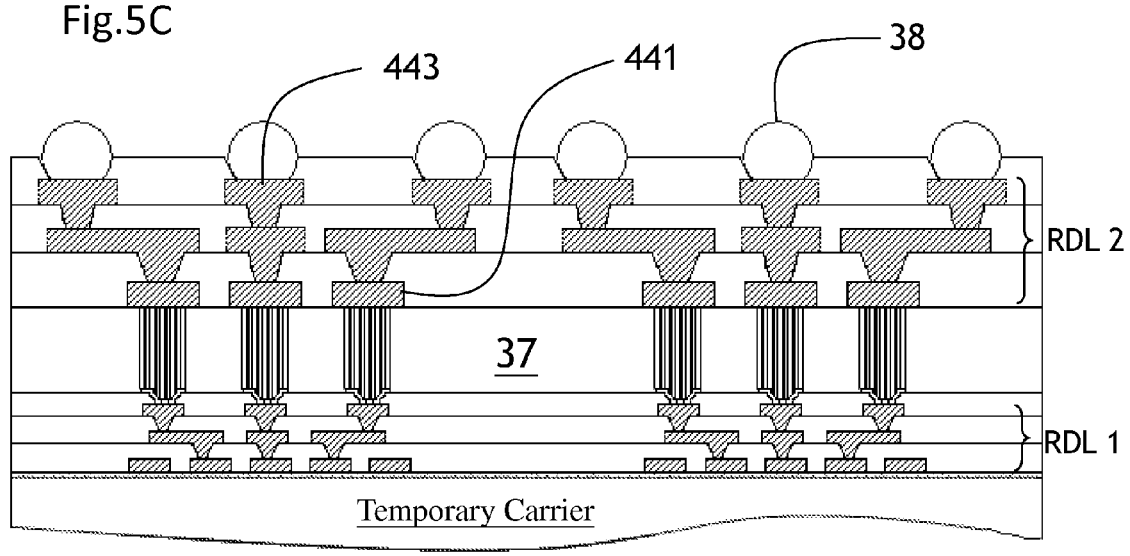
Figure 5D:
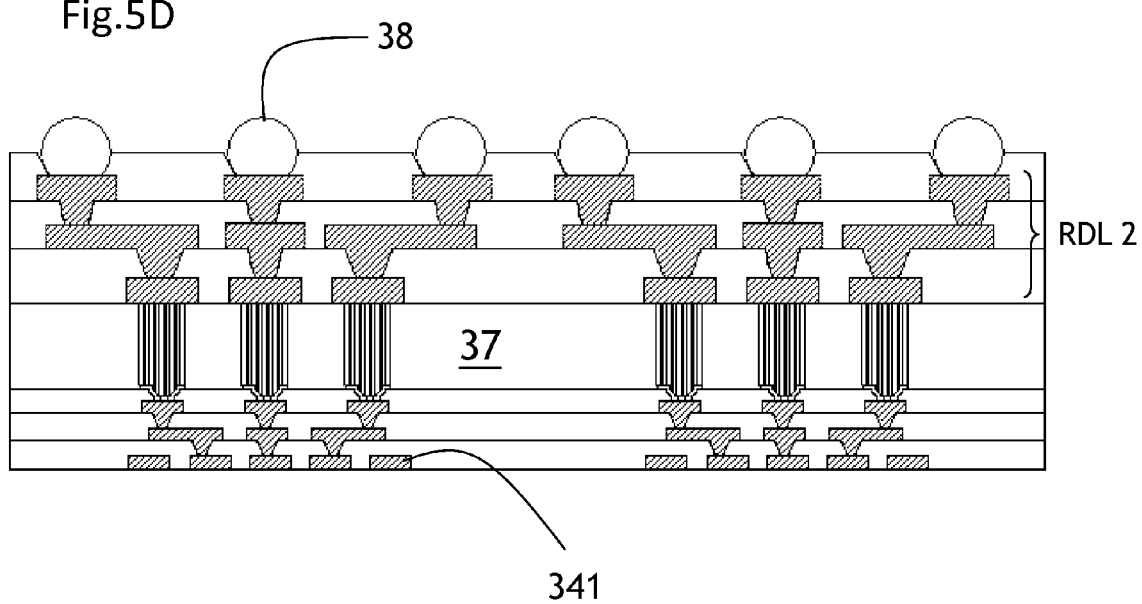
FIG. 5D is a fifth embodiment of the present invention.

FIG. 5D is a fifth embodiment of the present invention.

Figure 5E:
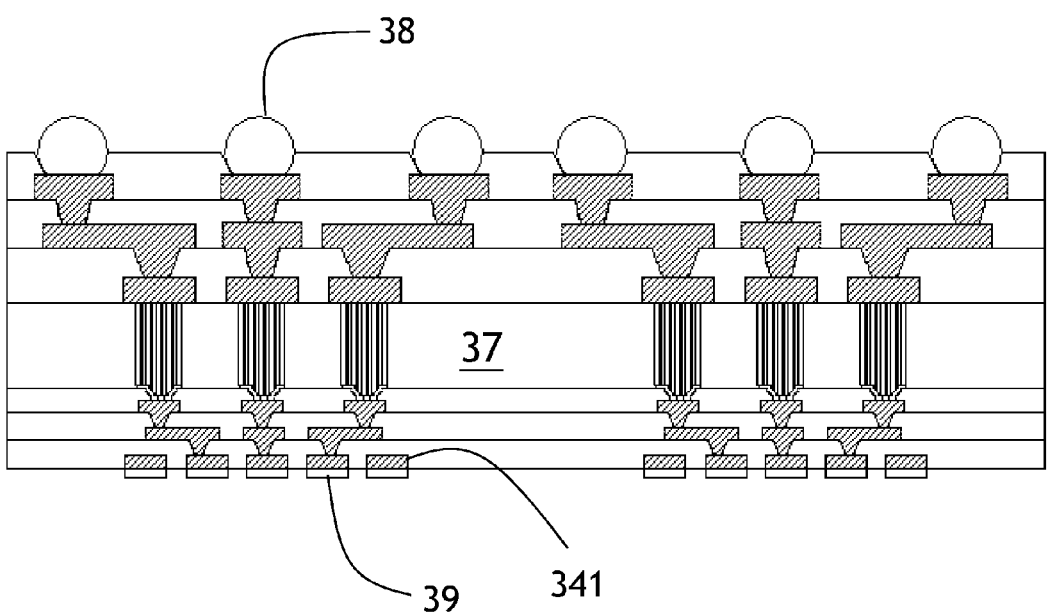
FIG. 5E is a sixth embodiment of the present invention.

FIG. 5E is a sixth embodiment of the present invention.

The manufacturing process of FIGS. 2A~2L is the same as described in previous paragraph and omitted here for simplification.

FIG. 5A shows: forming a second bottom metal pad 441 on top of a corresponding metal pillar 36;

FIG. 5B shows: forming a top RDL (RDL 2) on top of the molding compound 37; forming a plurality of second top metal pad 443 on top of the top RDL (RDL 2);

FIG. 5C shows: planting a plurality of solder ball 38, each is planted on top of a corresponding second top metal pad;

FIG. 5D shows: removing the temporary carrier; and removing the bottom seed layer 32 from bottom of each first bottom metal pad 341.

FIG. 5E shows: forming a bottom protection layer 39 on bottom of a corresponding first bottom metal pad 341.

Figure 5F:
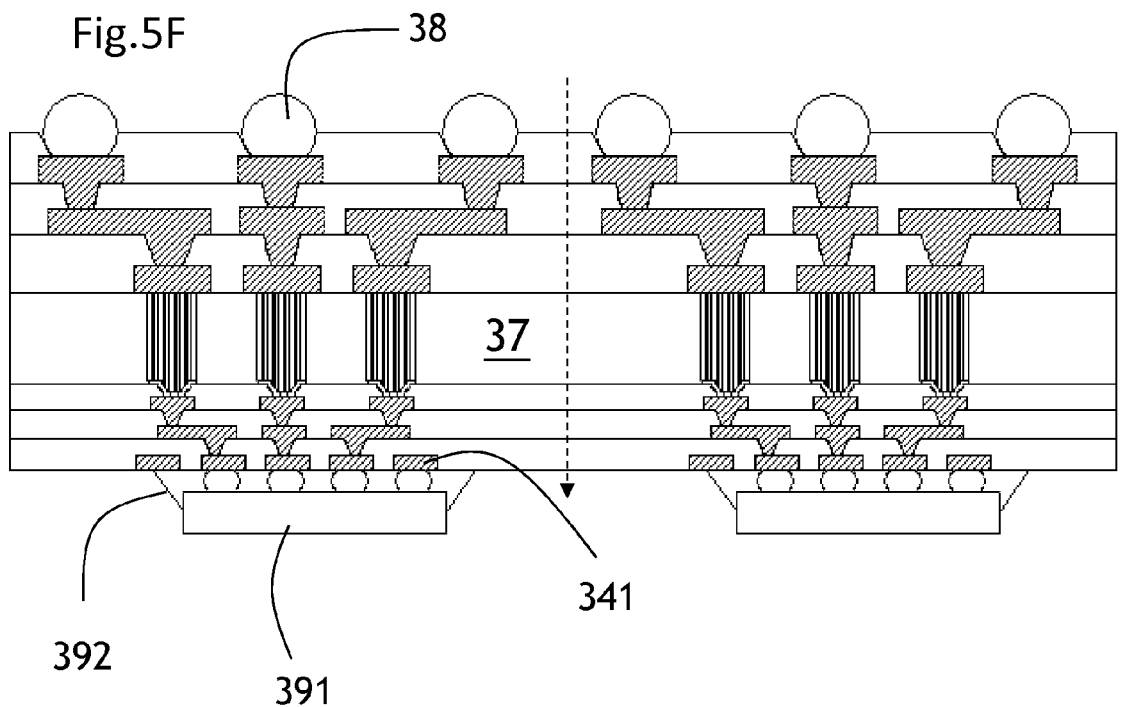
FIG. 5F shows an IC chip mounted on bottom of FIG. 5D
Figure 5F:
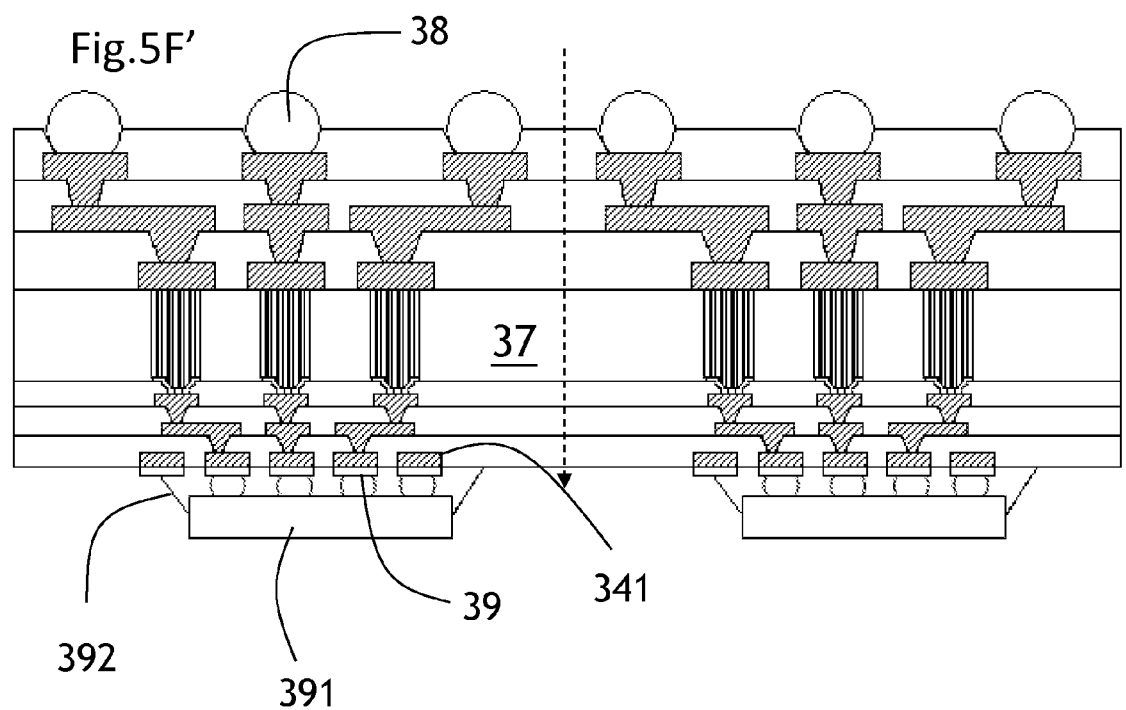

FIG. 5F shows an IC chip mounted on bottom of FIG. 5D

FIG. 5F shows an IC chip mounted on bottom of FIG. 5D; the chip 391 is electrically coupled to the first bottom metal pad 341 through a plurality of solder ball. An under fill 392 can be made between the chip 391 and the first bottom metal pad 341.

FIG. 5F' shows an IC chip mounted on bottom of FIG. 5E

FIG. 5F' shows an IC chip 391 mounted on bottom of FIG. 5E; the chip 391 is electrically coupled to the bottom protection layer 39 through a plurality of solder ball. An under fill 392 can be made between the chip 391 and the bottom protection layer 39.

Figure 5G:
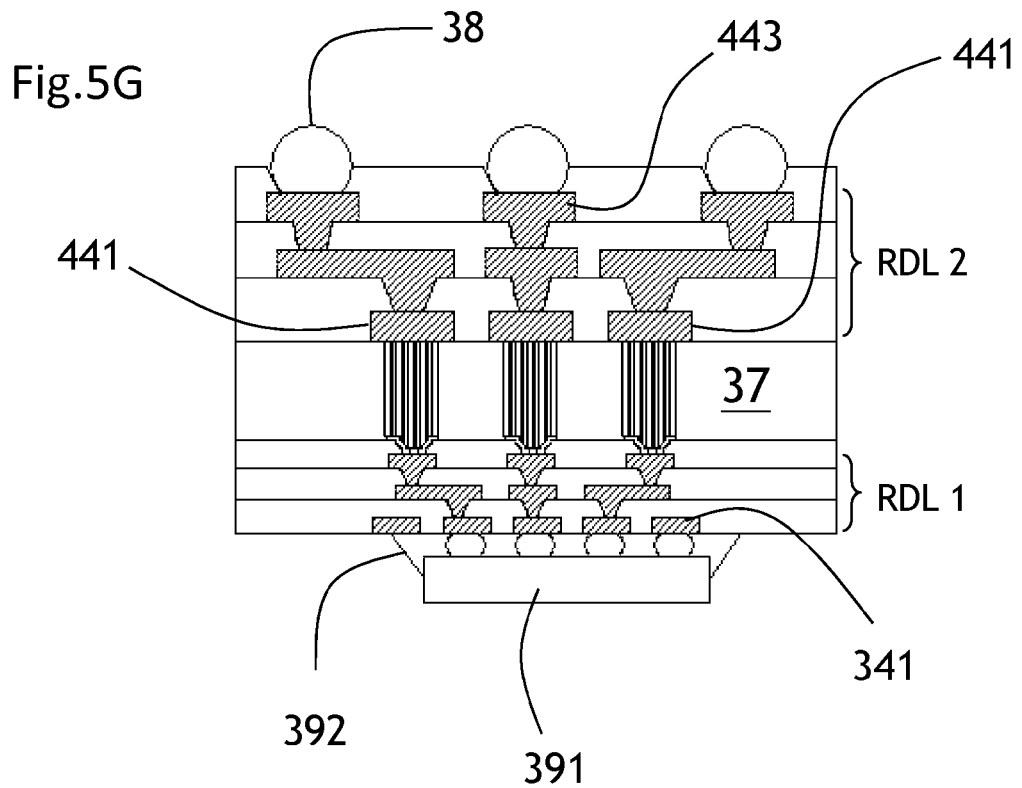
FIG. 5G shows an IC package unit obtained through singulating the product of FIG. 5F.
Figure 5G:
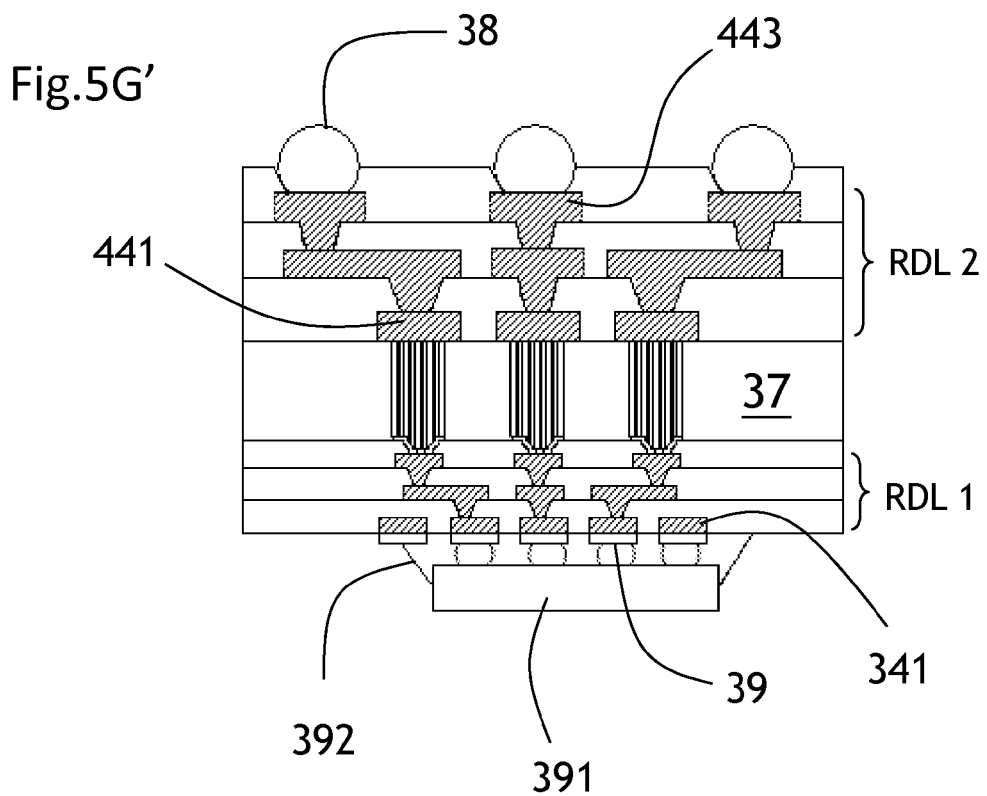

FIG. 5G shows an IC package unit obtained through singulating the product of FIG. 5F.

FIG. 5G shows an IC package which is a package based on the molding compound supported RDL of the fifth embodiment according to the present invention.

FIG. 5G' shows an IC package unit obtained through singulating the product of FIG. 5F'

FIG. 5G' shows an IC package which is a package based on the molding compound supported RDL of the sixth embodiment according to the present invention.

While several embodiments have been described by way of example, it will be apparent to those skilled in the art that various modifications may be configured without departs

What is claimed is:

1. A molding compound supported redistribution layer (RDL) structure for an integrated circuit (IC) package, the RDL structure comprising:
   a molding compound having opposite topmost and bottommost surfaces, and extending continuously from the topmost surface to the bottommost surface;
   a plurality of metal pillars, each extending through the molding compound and having
      a top end protruded above the topmost surface of the molding compound, and
      a bottom end protruded below the bottommost surface of the molding compound;
   a bottom RDL on bottom of the molding compound and having
      a plurality of first bottom metal pads, and
      a plurality of first top metal pads;
   a plurality of solder balls, each over the top end of a corresponding metal pillar among the plurality of metal pillars; and
   a chip mounted on the plurality of first bottom metal pads, wherein
   each solder ball among the plurality of solder balls covers
      a top face of the top end of the corresponding metal pillar, and extends around and covers a peripheral side face of the top end of the corresponding metal pillar,
   a density of the plurality of first bottom metal pads is higher than a density of the plurality of first top metal pads,
   the bottom end of each metal pillar among the plurality of metal pillars is electrically coupled to a corresponding first top metal pad among the plurality of first top metal pads, and
   in a thickness direction of the RDL structure, the bottom RDL is arranged between the chip and the plurality of metal pillars.

2. A molding compound supported RDL structure as claimed in claim 1, further comprising:
   a top protection layer between (i) each solder ball among the plurality of solder balls and (ii) the top end of the corresponding metal pillar among the plurality of metal pillars,
   wherein the top protection layer is in direct contact with and covers the top face and the peripheral side face of the top end of the corresponding metal pillar.

3. A molding compound supported RDL structure as claimed in claim 2, wherein the top protection layer is selected from the group consisting of Electroless Nickel/Electroless Palladium/Immersion Gold (ENEPIG) and Organic Solderability Preservatives (OSP).

4. A molding compound supported RDL structure as claimed in claim 2, further comprising:
   a bottom protection layer configured on bottom of a corresponding first bottom metal pad among the plurality of first bottom metal pads.

5. A molding compound supported RDL structure as claimed in claim 4, wherein the bottom protection layer is selected from the group consisting of ENEPIG and OSP.

6. A molding compound supported RDL structure as claimed in claim 1, wherein:
   each solder ball among the plurality of solder balls is in direct contact with the top face and the peripheral side face of the top end of the corresponding metal pillar among the plurality of metal pillars.

7. A molding compound supported RDL structure as claimed in claim 6, further comprising:
   a bottom protection layer configured on bottom of a corresponding first bottom metal pad among the plurality of first bottom metal pads.

8. A molding compound supported RDL structure as claimed in claim 7, wherein the bottom protection layer is selected from the group consisting of ENEPIG and OSP.

9. A molding compound supported RDL structure as claimed in claim 1, wherein an entirety of the chip is below the bottom RDL and the molding compound.

10. A molding compound supported RDL structure as claimed in claim 1, wherein the plurality of solder balls are in direct contact with the topmost surface of the molding compound.

11. A molding compound supported RDL structure as claimed in claim 1, wherein the molding compound is free of semiconductor material embedded therein.

12. A molding compound supported redistribution layer (RDL) structure for an integrated circuit (IC) package, the RDL structure comprising:
   a molding compound having opposite topmost and bottommost surfaces, and extending continuously from the topmost surface to the bottommost surface;
   a plurality of metal pillars, each extending through the molding compound and having
      a top surface coplanar with the topmost surface of the molding compound, and
      a bottom end protruded below the bottommost surface of the molding compound; and
   a bottom RDL configured on bottom of the molding compound and having
      a plurality of first bottom metal pads, and
      a plurality of first top metal pads,
   wherein
   a density of the plurality of first bottom metal pads is higher than a density of the plurality of first top metal pads,
   the bottom end of each metal pillar among the plurality of metal pillars is electrically coupled to a corresponding first top metal pad among the plurality of first top metal pads,
   the bottom RDL further comprises a topmost dielectric layer in direct contact with the bottommost surface of the molding compound,
   the plurality of first top metal pads and the bottom end of each metal pillar among the plurality of metal pillars are embedded in the topmost dielectric layer, and
   the plurality of metal pillars do not extend through the topmost dielectric layer.

13. A molding compound supported RDL structure as claimed in claim 12, further comprising:
   a top RDL configured on top of the molding compound and having
      a plurality of second bottom metal pads on top of the plurality of metal pillars, and
      a plurality of second top metal pads,
   wherein
   a density of the plurality of second bottom metal pads is higher than a density of the plurality of second top metal pads; and
   the top surface of each metal pillar among the plurality of metal pillars is electrically coupled to a corresponding second bottom metal pad among the plurality of second bottom metal pads.

14. A molding compound supported RDL structure as claimed in claim 13, further comprising:

a plurality of solder balls, each configured on top of a corresponding second top metal pad among the plurality of second top metal pads.

15. A molding compound supported RDL structure as claimed in claim 12, further comprising:
a bottom protection layer configured on bottom of a corresponding first bottom metal pad among the plurality of first bottom metal pads.

16. A molding compound supported RDL structure as claimed in claim 15, wherein the bottom protection layer is selected from the group consisting of ENEPIG and OSP.

17. A molding compound supported RDL structure as claimed in claim 12, further comprising:
a chip mounted on the plurality of first bottom metal pads, wherein an entirety of the chip is below the bottom RDL and the molding compound.

18. A molding compound supported RDL structure as claimed in claim 12, wherein the molding compound is free of semiconductor material embedded therein.

19. A fabricating process for a molding compound supported redistribution layer (RDL) structure for an integrated circuit (IC) package, the fabricating process comprising:
applying a release layer on top of a temporary carrier;
applying a bottom seed layer on top of the releasing layer;
applying a first patterned photo resist on top of the bottom seed layer;
forming a plurality of patterned first bottom metal pads;
stripping the first patterned photo resist;
stripping the bottom seed layer between the plurality of first bottom metal pads;
forming a bottom RDL using the plurality of first bottom metal pads as a starting point, the bottom RDL having a plurality of first top metal pads;
forming a first top dielectric layer with a plurality of openings, each exposing a top of a corresponding first top metal pad among the plurality of first top metal pads;
applying a top seed layer on top of the first top dielectric layer and the plurality of first top metal pads;
forming a second patterned photo resist on top of the top seed layer;
forming, in the second patterned photo resist, a plurality of metal pillars, each on top of a corresponding first top metal pad among the plurality of first top metal pads;
stripping the second patterned photo resist;
stripping the top seed layer between the plurality of metal pillars;
applying a molding compound to encapsulate the plurality of metal pillars, wherein each metal pillar among the plurality of metal pillars extends through the molding compound and has a bottom end protruded below the molding compound;
thinning the molding compound from top to expose top ends of the plurality of metal pillars;
planting a plurality of solder balls, each over the top end of a corresponding metal pillar among the plurality of metal pillars; and
mounting a chip on the plurality of first bottom metal pads,
wherein
the molding compound has opposite topmost and bottommost surfaces, and extends continuously from the topmost surface to the bottommost surface,
the top ends of the plurality of metal pillars protrude above the topmost surface of the molding compound,
the bottom ends of the plurality of metal pillars protrude below the bottommost surface of the molding compound,
each solder ball among the plurality of solder balls covers a top face of the top end of the corresponding metal pillar, and extends around and covers a peripheral side face of the top end of the corresponding metal pillar,
a density of the plurality of first bottom metal pads is higher than a density of the plurality of first top metal pads,
the bottom end of each metal pillar among the plurality of metal pillars is electrically coupled to a corresponding first top metal pad among the plurality of first top metal pads, and
in a thickness direction of the RDL structure, the bottom RDL is arranged between the chip and the plurality of metal pillars.

20. A fabricating process for a molding compound supported RDL structure as claimed in claim 19, further comprising:
before said planting the plurality of solder balls, forming a protection layer bracketing the exposed top end of each metal pillar among the plurality of metal pillars, wherein the top protection layer is in direct contact with and covers the top face and the peripheral side face of the top end of the corresponding metal pillar;
removing the temporary carrier; and
removing the bottom seed layer from bottom of each first bottom metal pad among the plurality of first bottom metal pads.

21. A fabricating process for a molding compound supported RDL structure as claimed in claim 20, further comprising:
forming a bottom protection layer on bottom of a corresponding first bottom metal pad among the plurality of first bottom metal pads.

22. A fabricating process for a molding compound supported RDL structure as claimed in claim 19, further comprising:
before said planting the plurality of solder balls, forming a protection layer bracketing the exposed top end of each metal pillar among the plurality of metal pillars;
wherein, in said planting the plurality of solder balls, the top protection layer is cleaned out by soldering flux and heat and each of the plurality of solder balls is in direct contact with the top face and the peripheral side face of the top end of the corresponding metal pillar among the plurality of metal pillars;
removing the temporary carrier; and
removing the bottom seed layer from bottom of each first bottom metal pad among the plurality of first bottom metal pads.

23. A fabricating process for a molding compound supported RDL structure as claimed in claim 22, further comprising:
forming a bottom protection layer on bottom of a corresponding first bottom metal pad among the plurality of first bottom metal pads.

* * * * *